United States Patent
Salih et al.

(10) Patent No.: US 10,032,937 B2
(45) Date of Patent: Jul. 24, 2018

(54) MONOLITHIC SERIES SWITCHING SEMICONDUCTOR DEVICE HAVING LOW-RESISTANCE SUBSTRATE CONTACT STRUCTURE AND METHOD

(71) Applicant: SEMICONDUCTOR COMPONENTS INDUSTRIES, LLC, Phoenix, AZ (US)

(72) Inventors: Ali Salih, Mesa, AZ (US); Gordon M. Grivna, Mesa, AZ (US); Daniel R. Heuttl, Gilbert, AZ (US); Osamu Ishimaru, Chiyagawa (JP); Thomas Keena, Gilbert, AZ (US); Masafumi Uehara, Yorikido (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/349,162

(22) Filed: Nov. 11, 2016

(65) Prior Publication Data

US 2018/0138319 A1 May 17, 2018

(51) Int. Cl.
*H01L 29/49* (2006.01)
*H01L 29/861* (2006.01)
*H01L 29/06* (2006.01)
*H01L 29/41* (2006.01)
*H01L 29/45* (2006.01)
*H01L 29/40* (2006.01)
*H01L 29/66* (2006.01)
*H01L 27/08* (2006.01)

(52) U.S. Cl.
CPC ........ *H01L 29/861* (2013.01); *H01L 27/0814* (2013.01); *H01L 29/0623* (2013.01); *H01L 29/0684* (2013.01); *H01L 29/407* (2013.01); *H01L 29/41* (2013.01); *H01L 29/45* (2013.01); *H01L 29/66136* (2013.01)

(58) Field of Classification Search
CPC .......................... H01L 29/861; H01L 27/0812; H01L 29/0623
See application file for complete search history.

(56) References Cited

U.S. PATENT DOCUMENTS 4,905,071 A 2/1990 Chalifour et al.
5,699,008 A * 12/1997 Pezzani .................. H01L 27/07
257/E27.028

(Continued)

*Primary Examiner* — Michael Shingleton
(74) *Attorney, Agent, or Firm* — Kevin B. Jackson

(57) ABSTRACT

A semiconductor device structure includes a region of semiconductor material with a first major surface and an opposing second major surface. A contact structure is disposed in a first portion of the region of semiconductor material and includes a tub structure extending from adjacent a first portion of the first major surface. A plurality of structures comprising portions of the region of semiconductor material extend outward from a lower surface of the tub structure. In some embodiments, the plurality of structures comprises a plurality of free-standing structures. A conductive material is disposed within the tub structure and laterally surrounding the plurality of structures. In one embodiment, the contact structure facilitates the fabrication of a monolithic series switching diode structure having a low-resistance substrate contact.

20 Claims, 10 Drawing Sheets

(56) References Cited

U.S. PATENT DOCUMENTS

| | | | | |
|---|---|---|---|---|
| 5,814,865 A | * | 9/1998 | Duvvury | H01L 27/0248 257/360 |
| 6,017,778 A | * | 1/2000 | Pezzani | H01L 21/761 257/E21.544 |
| 6,262,443 B1 | * | 7/2001 | Ballon | H01L 27/0814 257/109 |
| 6,984,860 B2 | | 1/2006 | Grivna et al. | |
| 7,256,119 B2 | | 8/2007 | Grivna et al. | |
| 2012/0068299 A1 | * | 3/2012 | Lin | H01L 27/0255 257/510 |
| 2012/0241903 A1 | * | 9/2012 | Shen | H01L 27/0255 257/510 |
| 2016/0268245 A1 | * | 9/2016 | Chen | H01L 27/0248 |

\* cited by examiner

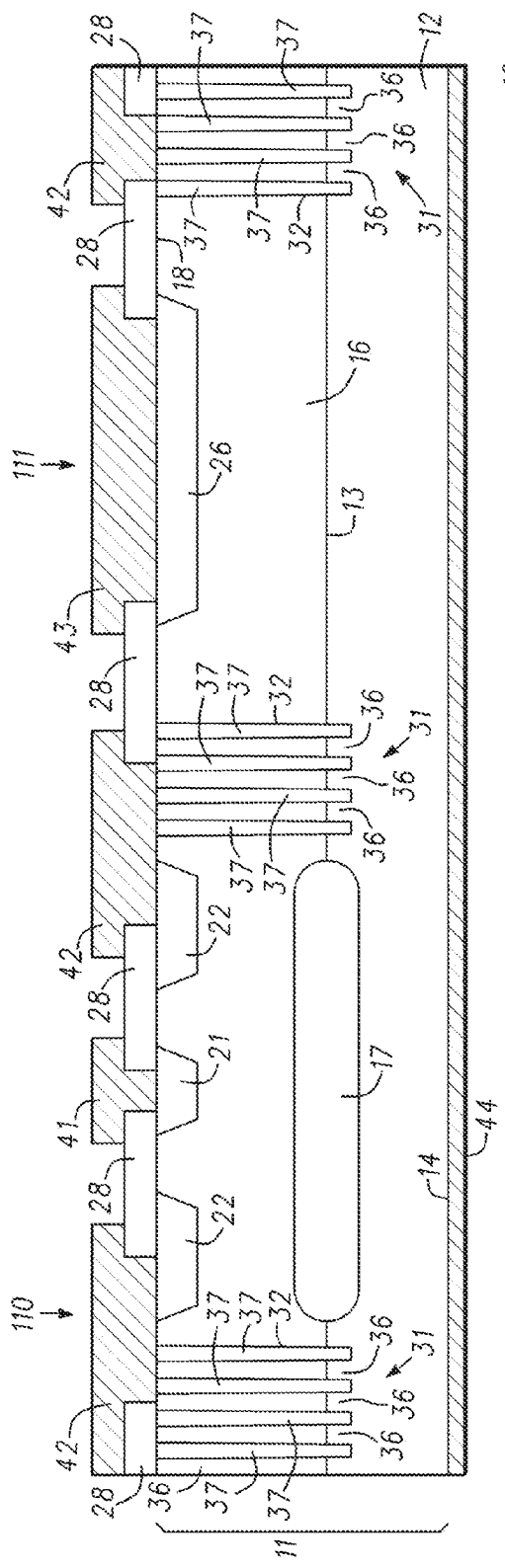
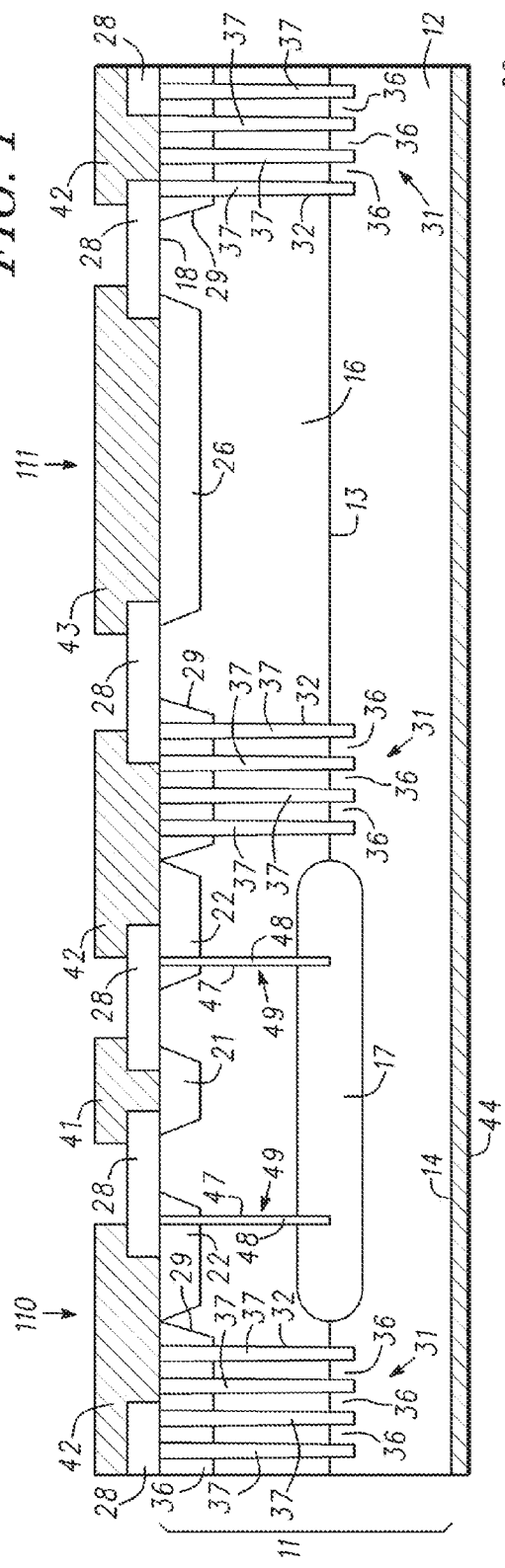

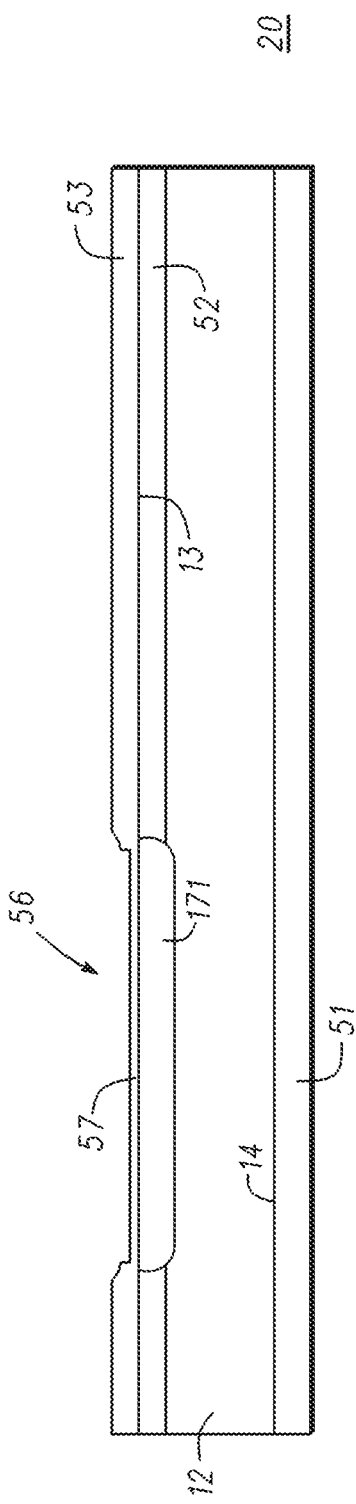
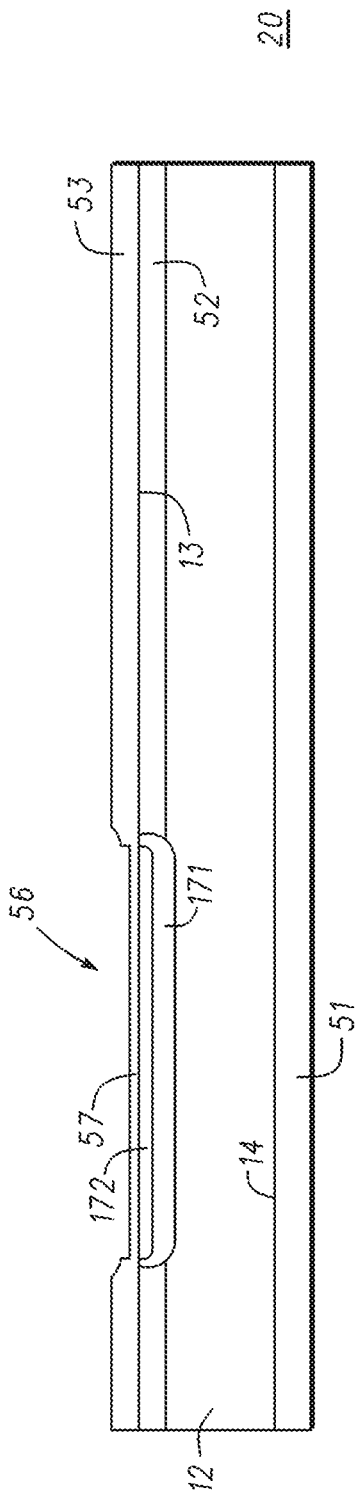

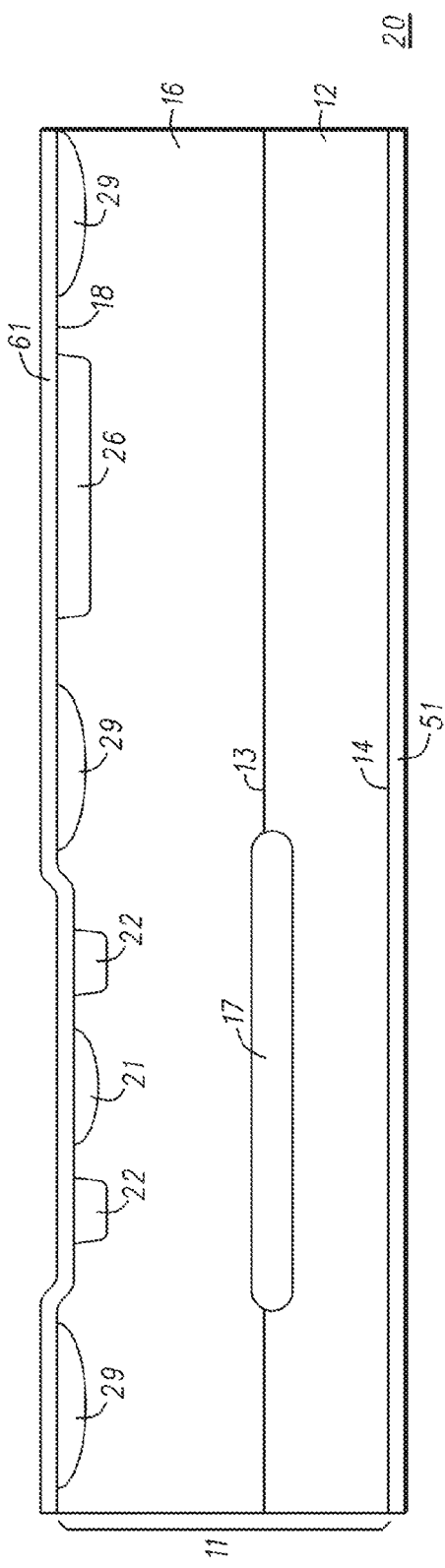
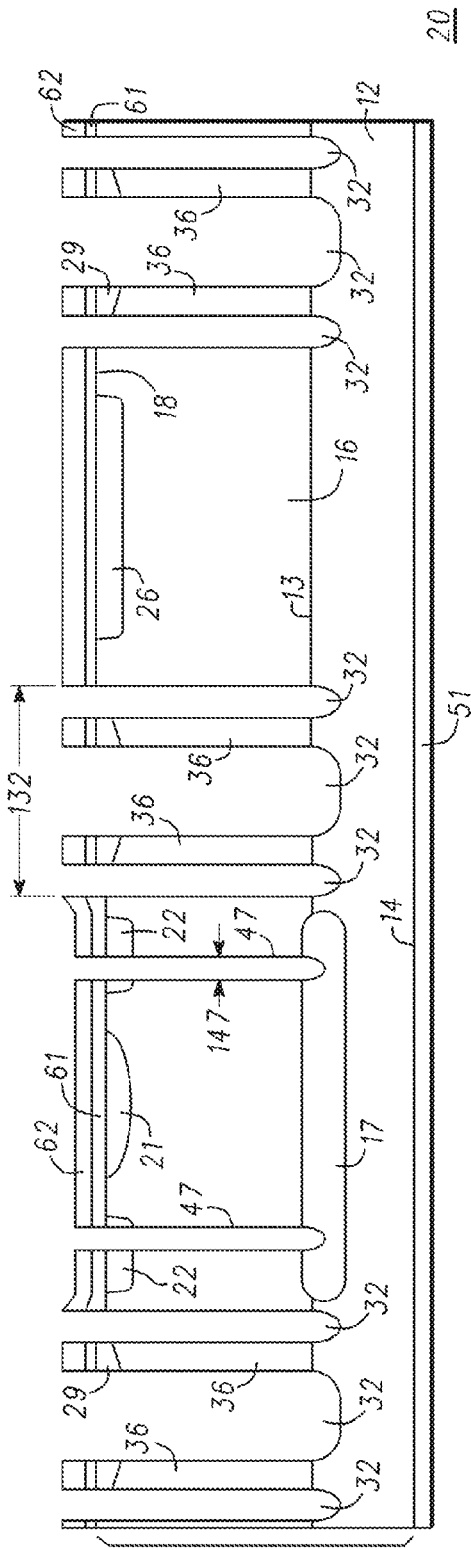

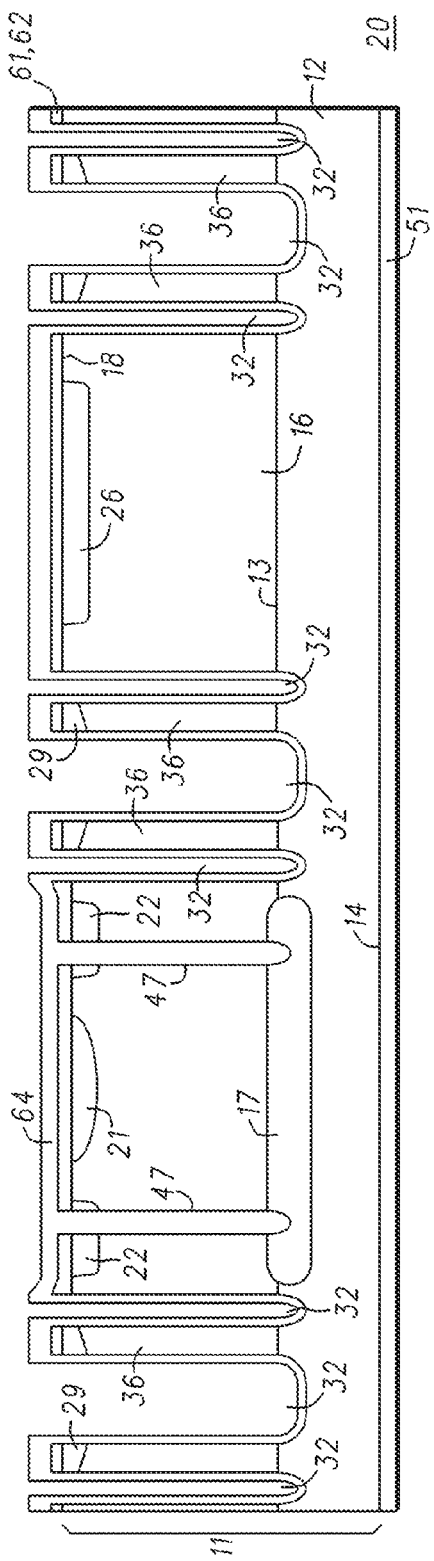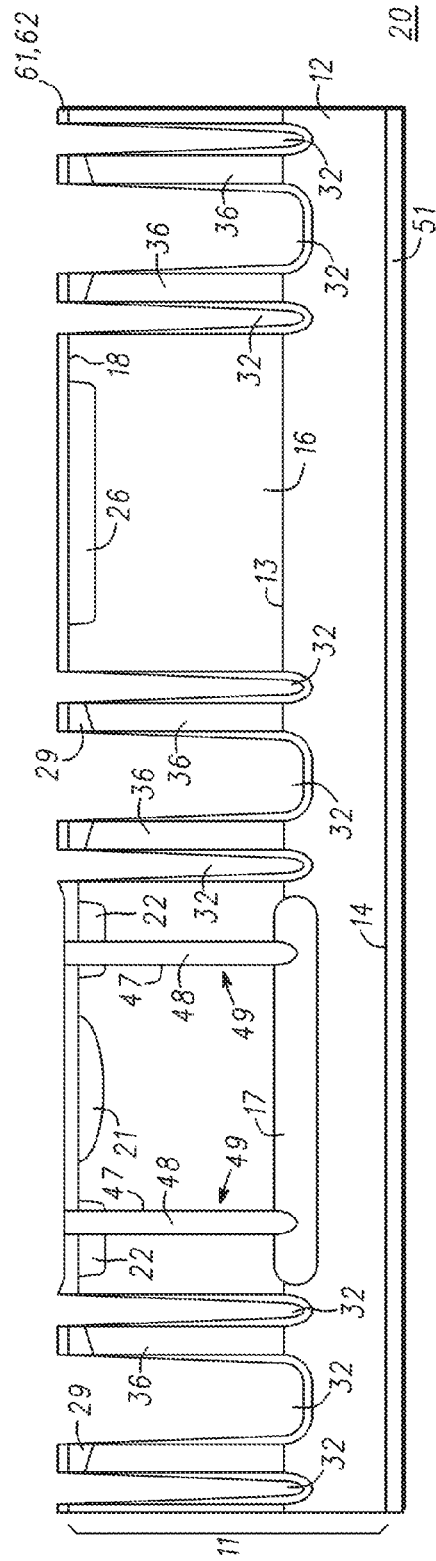

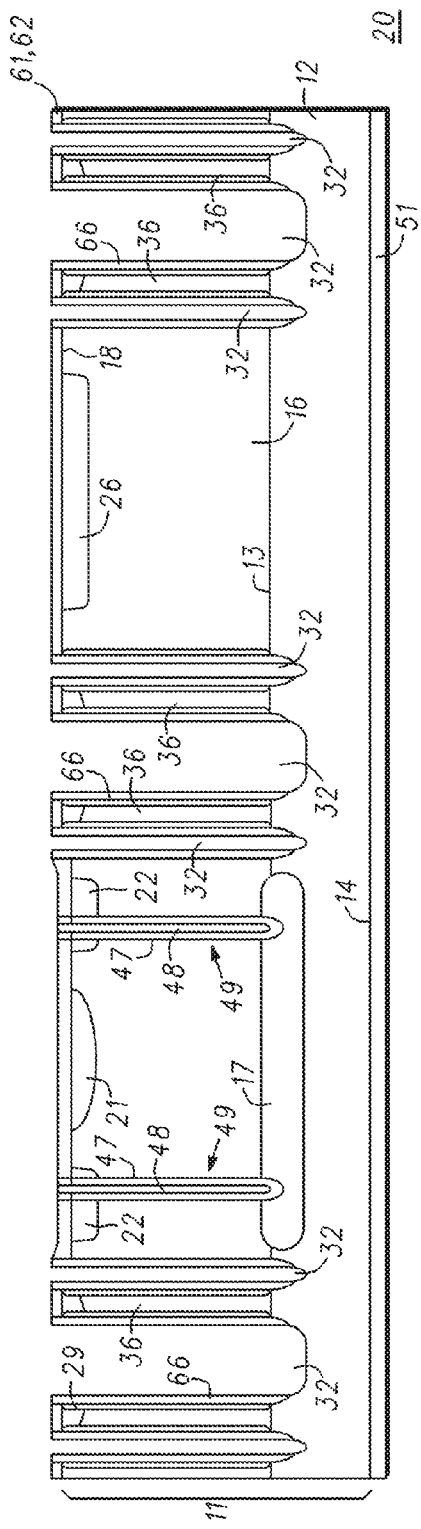
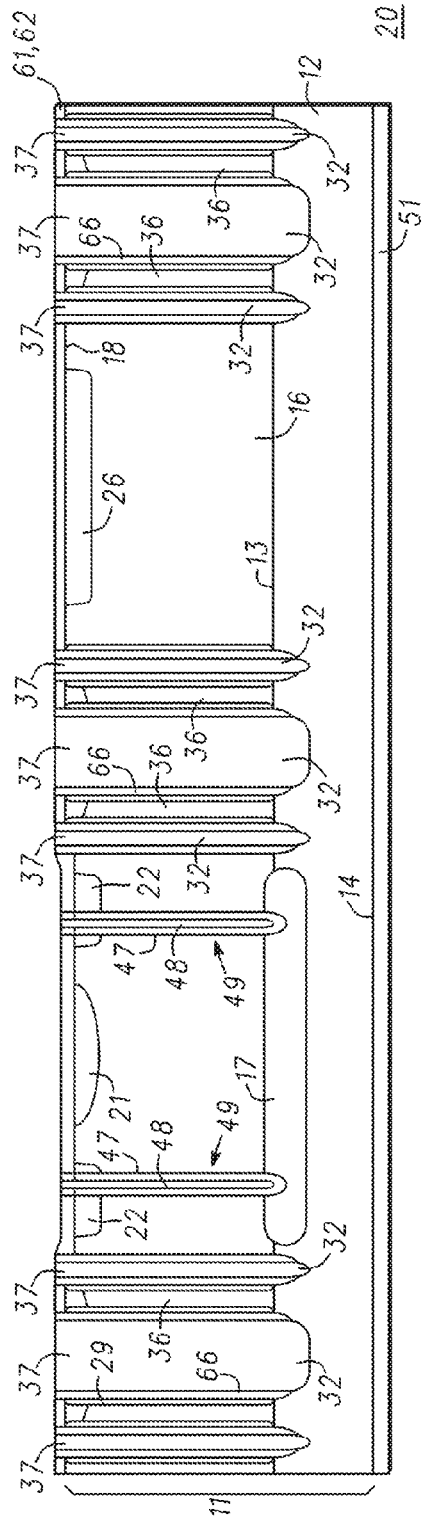

MONOLITHIC SERIES SWITCHING SEMICONDUCTOR DEVICE HAVING LOW-RESISTANCE SUBSTRATE CONTACT STRUCTURE AND METHOD

CROSS-REFERENCE TO RELATED APPLICATIONS

None.

BACKGROUND

The present invention relates, in general, to electronics and, more particularly, to semiconductor device structures and methods of manufacture.

Small signal diodes are non-linear semiconductor devices that are often used in switching applications where the diode device provides a high resistance below a specified voltage similar to an open switch, and provides a low resistance in an abrupt manner above the specified voltage similar to a closed switch. Small signal diodes are used in electronic circuit applications where high frequencies and/or small currents are utilized. Such applications include, for example, video, audio, and digital logic circuits. Small signal diodes generally have smaller junction areas compared to regular power diodes, which provides for lower junction capacitance making them more useful in higher frequency applications or in switching and clipping applications, which deal with short-duration pulse waveforms.

Dual series switching diodes are one type of small signal diode where two PN junction diodes are connected in series, and are used in high-speed switching, general-purposes switching, and reverse polarity protection applications. In the past, dual series switching diodes devices have consisted of two discrete (i.e., separate) diodes assembled in a three-leaded package. One problem with this past approach is that it required two die attach steps and two wire bond steps to complete the sub-assembly before the sub-assembly was encapsulated. This approach required added assembly time and assembly costs.

Accordingly, it is desirable to have a method and structure that provide a monolithic semiconductor device structure having multiple PN junction diodes (i.e., more than one) connected in series within a single piece of semiconductor material, and that provide a monolithic semiconductor device that meets or exceeds electrical performance requirements for multiple diodes in series structures.

BRIEF DESCRIPTION OF THE DRAWINGS

FIG. 1 illustrates an enlarged partial cross-sectional view of a semiconductor device structure in accordance with an embodiment of the present invention;

FIG. 2 illustrates an enlarged partial cross-sectional view of a semiconductor device structure in accordance with an embodiment of the present invention;

FIGS. 3-11 illustrate enlarged partial cross-sectional views of a semiconductor device structure at various steps in fabrication in accordance with an embodiment of the present invention;

Figure 9:
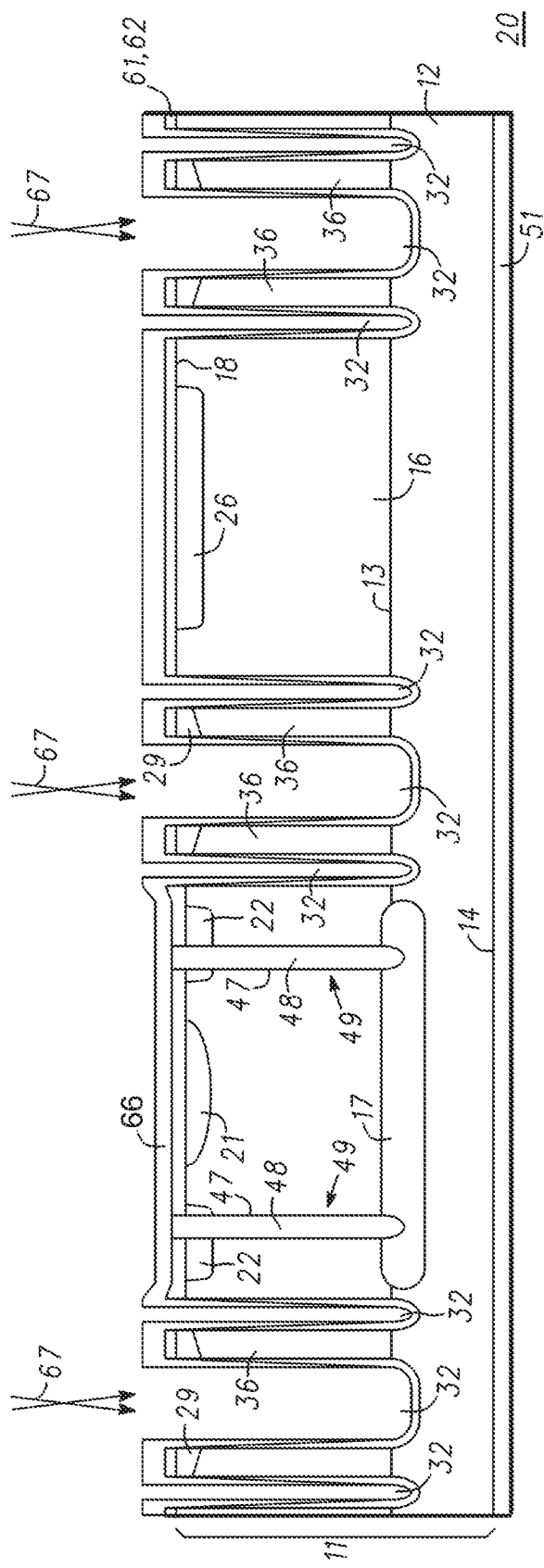

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of an MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action, but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a monolithic series switching semiconductor device structure having a lateral diode structure and a vertical diode structure disposed within a single semiconductor region. A substrate contact structure electrically connects a portion of the lateral diode structure to a substrate portion of the single semiconductor region. In one embodiment, the substrate contact structure includes a tub structure having a plurality of free-standing pillars disposed extending outward from a lower surface of the tub structure. A conductive material is disposed within the tub structure and laterally surrounds the plurality of free-standing pillars. The present embodiments provide for, among other things, a monolithic series switching semiconductor device with a very low resistance contact structure that, among other things, reduces assembly costs and cycle time. Also, in some embodiments, the present structure and method provide for a smaller package structure.

More particularly, in one embodiment, a semiconductor device structure comprises a region of semiconductor material comprising a semiconductor substrate having a first conductivity type and a semiconductor layer of a second conductivity type opposite to the first conductivity disposed adjacent the semiconductor substrate, the semiconductor layer defining a first major surface and the semiconductor substrate defining an opposing second major surface. A first doped region of the first conductivity type is disposed in a first portion the semiconductor layer adjacent the first major surface, a second doped region of the second conductivity type is disposed in a second portion of the semiconductor layer adjacent the first major surface, and a third doped region of the second conductivity type is disposed in a third portion of the semiconductor layer adjacent the first major surface. A substrate contact structure is disposed extending from adjacent the first major surface to the semiconductor substrate, wherein the substrate contact structure is electrically coupled to the second doped region to provide electrical communication between the second doped region and the semiconductor substrate. The first doped region, the semiconductor layer, and second doped region are configured as a lateral diode structure; the third doped region, the semiconductor layer, and the semiconductor substrate are configured as vertical diode structure; and the second major surface provides a common electrode for both the lateral diode structure and the vertical diode structure. In some embodiments, the substrate contact structure comprises a tub structure extending from the first major surface, a plurality of free-standing structures comprising portions of the semiconductor layer, and a conductive material disposed within the tub structure and laterally surrounding the plurality of free-standing structures. In some embodiments, the substrate contact structure is laterally spaced apart from the second doped region. In other embodiments, the second doped region may abut or at least partially overlap the substrate contact structure.

In another embodiment, the semiconductor device structure comprises a region of semiconductor material having a first major surface and an opposing second major surface. A contact structure is disposed in a first portion of the region of semiconductor material and comprises a tub structure extending from adjacent the first major surface, a plurality of structures comprising portions of the region of semiconductor material extending outward from a lower surface of the tub structure, and a conductive material disposed within the tub structure and laterally surrounding the plurality of structures.

In some embodiments, the region of semiconductor material comprises a semiconductor substrate having a first conductivity type and a semiconductor layer of a second conductivity type opposite to the first conductivity disposed adjacent the semiconductor substrate, the semiconductor layer defining the first major surface and the semiconductor substrate defining the second major surface; the contact structure extends to the semiconductor substrate; the plurality of structures comprises a plurality of free-standing structures; the semiconductor device structure further comprises a first doped region of the first conductivity type disposed in a second portion the semiconductor layer adjacent the first major surface; a second doped region of the second conductivity type disposed in the semiconductor layer at least proximate to the contact structure; and a third doped region of the second conductivity type disposed in a third portion of the semiconductor layer extending from the first major surface. The contact structure is electrically coupled to the second doped region to provide electrical communication between the second doped region and the semiconductor substrate; the first doped region, the semiconductor region, and second doped region are configured as a lateral diode structure; the third doped region, the semiconductor region, and the semiconductor substrate are configured as vertical diode structure; and the second major surface provides a common electrode for both the lateral diode structure and the vertical diode structure.

In a further embodiment, a method for forming a semiconductor device structure comprises providing a region of semiconductor material having a first major surface and an opposing second major surface, forming a tub structure extending from adjacent a first portion of the first major surface, wherein forming the tub structure includes forming a plurality of structures comprising portions of the region of semiconductor material, and providing a conductive material within the tub structure, wherein the conductive material laterally surrounds the plurality of structures to provide a contact structure.

In some embodiments, providing the region of semiconductor material comprises a semiconductor substrate having a first conductivity type and a semiconductor layer of a second conductivity type opposite to the first conductivity disposed adjacent the semiconductor substrate, the semiconductor layer defining the first major surface and the semiconductor substrate defining the second major surface. In a further embodiment, forming the tub structure comprises forming the tub structure extending at least proximate to the semiconductor substrate. In another embodiment, forming the tub structure comprises forming a plurality of free-standing structures. In further embodiments, the method can further comprise forming a first doped region of the first conductivity type disposed in a second portion the semiconductor layer adjacent the first major surface; forming a second doped region of the second conductivity type disposed in the semiconductor layer at least proximate to the contact structure; forming a third doped region of the second conductivity type disposed in a third portion of the semiconductor layer adjacent the first major surface, and electrically coupling the contact structure to the second doped region to provide electrical communication between the second doped region and the semiconductor substrate.

FIG. 1 illustrates an enlarged partial cross-sectional view of a semiconductor device structure 10 or structure 10 in accordance with one embodiment. In the present embodiment, semiconductor device structure 10 is illustrated as a monolithic series switching semiconductor device. It is understood that the attributes of the present description can be applied to other semiconductor device structures. In some embodiments, structure 10 includes a work piece 11, which can be a region of semiconductor material 11, a body of semiconductor material 11, or a semiconductor region 11.

In some embodiments, region of semiconductor material 11 includes a semiconductor substrate 12 comprising, for example, silicon or other Group IV semiconductor materials. In one embodiment, substrate 12 is a substantially monocrystalline semiconductor silicon wafer having a major surface 13 and an opposing major surface 14. In one embodiment, substrate 12 is a heavily doped P-type conductivity substrate with a dopant concentration in a range from about $3.0 \times 10^{18}$ atoms/cm$^3$ through about $8.0 \times 10^{18}$ atoms/cm$^3$. In other embodiments, substrate 12 can comprise other semiconductor materials, such as IV-IV semiconductor materials or III-V semiconductor materials.

Region of semiconductor material 11 further includes a semiconductor layer 16, semiconductor region 16, doped region 16, or doped layer 16, which can be formed in, on, or overlying substrate 12. In the present embodiment, semiconductor layer 16 is an N-type conductivity region or layer, and can be formed using epitaxial growth techniques or other formation techniques as known to those skilled in the art. In some embodiments, semiconductor layer 16 can be doped with phosphorous, arsenic, or antimony. In one embodiment, semiconductor layer 16 has a dopant concentration in a range from about $6.0 \times 10^{14}$ atoms/cm$^3$ through about $8.0 \times 10^{14}$ atoms/cm$^3$. In some embodiments, the thickness of semiconductor layer 16 is in a range from about 8.0 microns through about 12.0 microns. It is understood that the dopant concentration and thickness of semiconductor layer 16 is adjusted based on the desired electrical characteristics of semiconductor device structure 10. In the present embodiment, semiconductor layer 16 defines a major surface 18, which is opposed to major surface 14.

In some embodiments, semiconductor device structure 10 includes a buried layer 17, buried region 17, or doped region 17 disposed in a portion of region of semiconductor material 11 between substrate 12 and semiconductor layer 16. In one embodiment, buried layer 17 has an N-type conductivity type and has a dopant concentration in a range from about $8.0 \times 10^{14}$ atoms/cm$^3$ through about $1.2 \times 10^{15}$ atoms/cm$^3$. A doped region 21 having P-type conductivity is disposed in a portion of semiconductor layer 16 adjacent major surface 18, and one or more doped regions 22 having N-type conductivity are disposed in other portions of semiconductor layer 16 adjacent major surface 18 and laterally spaced apart from doped region 21. A doped region 26 having N-type conductivity is disposed in a further portion of semiconductor layer 16 adjacent major surface 18. Buried layer 17 and doped regions 21, 22, and 26 can be formed using ion implantation, spin-on, chemical vapor deposition, solid source, or other doping techniques known to those skilled in the art, and can be combined with annealing and/or diffusion processes.

In some embodiments, a dielectric region 28 or dielectric structure 28 is disposed adjacent major surface 18 and is patterned to provide predetermined openings to doped regions 21, 22, and 26. Dielectric region 28 can comprise one or more dielectric layers including, for example, oxide, nitrides, combinations thereof, or other dielectric or insulative materials as known to those skilled in the art. In some embodiments, dielectric region 28 includes a combination of thermal oxide, deposited oxide, deposited nitride, and deposited oxide, which will be described later. Patterning techniques, such as masking and etching techniques can be used to provide openings in dielectric region 28 in predetermined locations.

In accordance with the present embodiment, semiconductor device structure 10 further includes one or more a substrate contact structures 31 disposed extending from major surface 18 into region of semiconductor material 11. In one preferred embodiment, substrate contact structures 31 extend from adjacent to or proximate to major surface 18 through semiconductor layer 16 to within a portion of substrate 12. It is understood that substrate contact structure 31 can extend from above or outward from major surface 18, can extend recessed below or inward from major surface 18, or can extend from a position substantially coplanar with major surface 18. Also, in some embodiments, substrate contact structures 31 can abut doped regions 22 on one or more sides of doped regions 22.

In accordance with the present embodiment, substrate contact structures 31 include a tub structure 32, a channel structure 32, a well structure 32, or a recessed structure 32 extending from major surface 18; one or more structures 36, free-standing structures 36, free-standing features 36, or free-standing elements 36 extending upward or outward from a lower surface of tub structure 32; and a conductive material 37, tub-fill conductive material 37, or conductive-fill material 37 disposed within tub structure 32 such that conductive material 37 laterally surrounds free-standing structures 36. In accordance with the present embodiment, free-standing structures 36 comprise portions of semiconductor layer 16, which remain in place after tub structure 32 is formed. As will be described in more detail later, free-standing structures 36 can be a variety of shapes in cross-sectional view, such as circular, square, rectangular, polygonal, or similar shapes. In one preferred embodiment, free-standing structures 36 are spaced apart from and are not connected to sidewall surfaces of tub structure 32. In other embodiments, one or more structures 36 can be connected to one or more sidewall surfaces of tub structure 32 in addition to the lower surface of tub structure 32. In one embodiment, tub structure 32 and structures 36 can be formed using masking and removal techniques, including, but not limited to, photolithographic and etch techniques.

Conductive material 37 comprises one or more conductive materials, such as metals, doped semiconductor materials, doped polycrystalline semiconductor materials, silicides, combinations thereof, or other conductive materials as known to those skilled in the art. In some embodiments, conductive material 37 comprises, at least in part, a doped polycrystalline semiconductor material, such as doped polysilicon. In one embodiment, when conductive material 37 comprises a doped semiconductor material, conductive material 37 has the same conductivity type as substrate 12. In the present embodiment, conductive material 37 preferably has P-type conductivity. In some embodiments, when conductive material 37 comprises a doped semiconductor material, dopant from conductive material 37 can diffuse from conductive material 37 into free-standing structures 36 so that free-standing structures 36 have the same conductivity type as conductive material 37 in the finished semiconductor device structure 10. This feature of the present embodiment provides an additional reduction in resistance for the conduction path.

In one preferred embodiment, conductive material 37 adjoins free-standing structures 36 without an intervening dielectric layer between conductive material 37 and free-standing structures 36. Conductive material 37 can be substantially coplanar with major surface 18, can be recessed below major surface 18, or can extend above or outward from major surface 18. Conductive material 37 can be formed using deposition, sputtering, plating, evaporation, and/or other formation techniques as known to those skilled in the art. When conductive material 37 comprises a doped polycrystalline semiconductor material, the polycrystalline semiconductor material can be doped in-situ or doped after deposition.

Semiconductor device structure 10 further includes an electrode 41 or conductive structure 41 electrically connected to doped region 21, an electrode 42 or conductive structure 42 electrically connected to doped region 22 and substrate contact structures 31, an electrode 43 or conductive structure 43 electrically connected to doped region 26, and an electrode 44 or conductive structure 44 electrically connected to substrate 12 (for example, along major surface 14). Electrodes 41, 42, 43, and 44 comprise conductive materials, such as one or more metal materials. In some embodiments, electrodes 41, 42, and 43 can comprise Al, Al-alloys, such as AlSi or AlCuSi, Al/Ni/Au, Al/Ni/Cu, Cr/Ni/Au, Ti/Ni/Au, Ti/Cu/Ni/Au, Ti/Ni/Ag, or similar materials as known to those skilled in the art. In some embodiments, electrode 44 can sintered Au, Al, Al-alloys, such as AlSi or AlCuSi, or similar materials as known to those skilled in the art.

In accordance with the present embodiment, doped region 21, semiconductor layer 16, and doped region 22 are configured as a lateral diode structure 110. Electrode 42 electrically connects doped region 22 and substrate contact structures 31 together, and substrate contact structures 31 are configured to provide a low-resistance conduction path to electrode 44, which is disposed adjacent major surface 14 of region of semiconductor material 11. Further in accordance with the present embodiment, doped region 26, semiconductor layer 16 and substrate 12 are configured as a vertical diode structure 111. In the present embodiment, electrode 44 is configured as a common electrode for both lateral diode structure 110 and vertical diode structure 111. More particularly, in the present embodiment, electrode 41 is configured as an anode electrode and electrode 44 is configured as a cathode electrode for lateral diode structure 110. In addition, electrode 44 is configured as an anode electrode and electrode 43 is configured as an anode electrode for vertical diode structure 111. In accordance with the present embodiment, substrate contact structures 31 facilitate the inclusion or integration of lateral diode structure 110 and vertical diode structure 111 within a single region of semiconductor material 11 to provide monolithic series switching semiconductor device 10. Since semiconductor device 10 is monolithic, it is an improvement over prior structures that require two separate or discrete devices to provide the same functionality as semiconductor device structure 10. Thus, semiconductor device structure 10 provides for, among other things, a reduction in assembly cycle time and costs. In addition, semiconductor device structure 10 can be assembled into smaller package footprints compared to related devices.

FIG. 2 illustrates an enlarged partial cross-sectional view of a semiconductor device structure 20 in accordance with another embodiment. Semiconductor device structure 20 is similar to semiconductor device structure 10 and only the differences will be described hereinafter. In accordance with the present embodiment, semiconductor device structure 20 further comprises one or more conductive trench structures 49 or conductive cathode structures 49 disposed to extend adjacent major surface 18 through doped region(s) 22 through semiconductor layer 16 and terminating adjacent or within buried layer 17. In one embodiment, conductive trench structures 49 include a trench 47 and a conductive material 48 disposed within trench 47. In one embodiment, conductive material 48 includes a conductive semiconductor material, such as a conductive polycrystalline semiconductor material. In one preferred embodiment, conductive material 48 is a highly doped N-type conductivity polysilicon material. In accordance with the present embodiment, conductive trench structures 49 are configured to reduce leakage current and to improve the forward conduction characteristics of lateral diode structure 110.

In an optional embodiment, doped regions 29 having a P-type conductivity can be disposed adjoining an upper portion of substrate contact structures 31 to further increase the dopant concentration of substrate contract structures 31 adjacent to major surface 18. In some embodiments, doped regions 29 are wider than substrate contact structures 31 such that a portion of doped region 29 is laterally interposed between doped region 22 and substrate contract structure 31. In other embodiments, doped regions 29 can abut side portions of substrate contact structures 31.

Experimental results were obtained from semiconductor device structure 20 and compared to target specifications for a 100 volt switching diode dual series device. These results show that semiconductor device structure 20 meets the requirements for key aspects of the target specifications. Table 1 provides a summary of the results.

TABLE 1

Summary Data for Structure 20

| Criteria | Target Specification | Lateral Device 110 | Vertical device 111 |
|---|---|---|---|
| VBR: Reverse Breakdown Voltage (I(Br) = 100 Amps) | >100 Volts(dc) | 117 Volts | 125 Volts |
| IR: Reverse Leakage Current (VR = 100 Vdc) | <2.5 micro(u) Amps(dc) | 0.31 uA | 0.003 uA |
| VF: Forward Voltage | | | |
| (IF = 1.0 mAdc) | <715 mV(dc) | 644 mV(dc) | 691 mV(dc) |
| (IF = 10 mAdc) | <855 mV(dc) | 776 mV(dc) | 818 mV(dc) |
| (IF = 50 mAdc) | <1000 mV(dc) | 919 mV(dc) | 923 mV(dc) |
| (IF = 150 mAdc) | <1250 mV(dc) | 1092 mV(dc) | 1069 mV(dc) |

Turning now to FIGS. 3-15, a method of forming semiconductor device structure 20 as well as substrate contact structures 31 will be described in accordance with one embodiment. FIG. 3 illustrates a partial cross-sectional view of semiconductor device structure 20 at an early stage of fabrication. In one embodiment, semiconductor substrate 12 is provided having a heavily doped P-type conductivity with a dopant concentration in a range from about $3.0 \times 10^{18}$ atoms/cm$^3$ through about $8.0 \times 10^{18}$ atoms/cm$^3$. In some embodiments, a back-seal structure 51 is provided adjacent major surface 14 and a buffer layer 52 is provided adjacent major surface 13. Back-seal structure 51 can comprise a dielectric material, such as an oxide, a nitride, or combination thereof, and can be configured to reduce auto-doping from substrate 12 during subsequent processing. In some embodiments, buffer layer 52 is a lightly doped P-type conductivity layer and can be formed using epitaxial growth techniques or by counter-doping substrate 12.

A masking layer 53 is provided adjacent major surface 13. In some embodiments, masking layer 53 can be a dielectric material, such as an oxide. In some embodiments, masking layer 153 can be approximately 1.0 micron of thermal oxide. Next, an etching process can be used to form an opening 56 in masking layer 53 in a location pre-selected for buried layer 17. A portion of substrate 12 is then doped with an N-type conductivity dopant to provide doped region 171, which is used to form buried layer 17. In some embodiments, doped region 171 can be formed using ion implantation, spin-on, CVD, solid source, or other doping techniques as known to those skilled in the art. In one embodiment, an antimony dopant source is used and the dopant annealed to diffuse the dopant into substrate 12. After the anneal step, a thin oxide film 57 may form within opening 56.

FIG. 4 illustrates a partial cross-sectional view of semiconductor device structure 20 after additional processing. In one embodiment, an ion implantation step is used to provide another doped region 172 to increase the amount of N-type dopant present. In some embodiments, phosphorous is ion implanted using one or more doses in a range from about $1.0 \times 10^{15}$ atoms/cm$^2$ through about $3.0 \times 10^{15}$ atoms/cm$^2$ and an ion implantation energy in a range from about 100 keV through about 150 keV. In the alternative, arsenic and/or antimony dopants can be used for doped region 172.

FIG. 5 illustrates an enlarged partial cross-sectional view of semiconductor device structure 20 after further processing. In one embodiment, masking layer 53 and film 57 are removed while leaving back-seal structure 51 in place. Next, semiconductor layer 16 is provided adjacent major surface 13 of substrate 12. In one embodiment, epitaxial growth techniques are used to deposit semiconductor layer 16 overlying substrate 12 to provide region of semiconductor material 11. The dopant concentration, dopant profile (i.e., uniform or non-uniform, such as graded), and thickness of semiconductor layer 16 are determined based on the desired electrical characteristics of semiconductor device structure 20. In an embodiment of semiconductor device structure 20 for a 100 volt device, semiconductor layer 16 has a thickness of about 10 microns and a dopant concentration in a range from about $6.0 \times 10^{14}$ atoms/cm$^3$ through about $8.0 \times 10^{14}$ atoms/cm$^3$, and has an N-type conductivity type. During the formation of semiconductor layer 16, doped regions 171 and 172 can diffuse to form buried layer 17 proximate to the interface between semiconductor layer 16 and substrate 12.

In a subsequent step, a masking layer 61 is provided adjacent major surface 18 of semiconductor layer 16. In some embodiments, masking layer 61 comprises one or more dielectric materials. In one embodiment, masking layer 61 comprises an oxide formed using dry oxidation techniques, and has a thickness in a range from about 0.04 microns through about 0.06 microns. In a subsequent step, another masking layer (not shown) is disposed over masking layer 61 and provided with openings corresponding to the desired locations of doped regions 21 and 29. In one embodiment, a photoresist layer is used, and then boron ion implantation is used to implant P-type dopants into semiconductor layer 16 for doped regions 21 and 29. The photoresist layer is then stripped, and the implanted dopant annealed and diffused to provide doped regions 21 and 29. In one embodiment, one or more implant doses in a range from about $1.0 \times 10^{15}$ atoms/cm$^2$ through about $3.0 \times 10^{15}$ atoms/cm$^2$ with implant energies in a range from about 30 keV through about 60 keV are used to form doped regions 21 and 29. In some embodiments, doped regions 21 and 29 extend into semiconductor layer 16 in a range from about 1.0 microns through about 4.0 microns.

In some embodiments, a second photoresist layer (not shown) is provided over masking layer 61 and then patterned to provide openings corresponding to the desired locations of doped region 22 and 26. Phosphorous ion implantation can be used to implant N-type dopants into semiconductor layer 16 for doped regions 22 and 26. In one embodiment, one or more implant doses in a range from about $1.0 \times 10^{16}$ atoms/cm$^2$ through about $2.0 \times 10^{16}$ atoms/cm$^2$ with implant energies in a range from about 100 keV through about 150 keV are used to form doped regions 22 and 26. After the doping step, the second photoresist layer is removed and the N-type dopant annealed and diffused to provide doped regions 22 and 26. In some embodiments, doped regions 22 and 26 extend into semiconductor layer 16 in a range from about 1.0 microns through about 4.0 microns. It is understood that in the alternative (or in addition to), arsenic and antimony can be used as the N-type dopant source for doped regions 22 and 26. Also, in other embodiments, the dopants for doped regions 21, 22, 26, and 29 can be annealed and/or diffused at the same time.

FIG. 6 illustrates an enlarged partial cross-sectional view of semiconductor device structure 20 after still further processing. In one embodiment, a masking layer 62 is disposed adjacent masking layer 61. In some embodiments, masking layer 62 can be a dielectric material, such as an oxide or nitride. In one embodiment, masking layer comprises a deposited oxide having a thickness in a range from about 0.18 microns to about 0.25 microns. Next, another masking layer (not shown) can be disposed adjacent masking layer 62, and in some embodiments, comprises a photoresist material. The photoresist material is then patterned to provide openings where trenches 47 and tub structures 32 are to be formed in region of semiconductor material 11. After the openings in the photoresist material are formed, exposed portions of masking layers 61 and 62 are removed to expose portions of major surface 18.

Next, a removal process is used to remove material from portions of region of semiconductor material 11 to form trenches 47 and tub structures 32 extending inward from major surface 18. In accordance with the present embodiment, this removal process also provides structures 36, such as free-standing structures 36 extending upward or outward from lower surfaces of tub structures 32. In some embodiments, etching techniques are used to form trenches 47 and tub structures 32. In most embodiments, trenches 47 can extend into region of semiconductor material 11 so that trenches 47 contact at least a portion of buried layer 17 as generally illustrated in FIG. 6. Also, tub structures 32 can extend into region of semiconductor material 11 so that tub structures 32 contact at least a portion of substrate 12. In other embodiments, trenches 47 and tub structures 32 may terminate short of buried layer 17 and substrate 12, and dopants from the conductive material placed within trenches 47 and tub structures 32 can diffuse outward from these features to contact buried layer 17 and substrate 12 respectively in the final structures. Also, dopant from buried layer 17 and substrate 12 may diffuse upward to make contact in the final structures.

In one preferred embodiment, reactive ion etching techniques are used to form trenches 47 and tub structures 32. By way of illustrative example only, a fluorine or chlorine based chemistry may be used to form trenches 47 and tub structures 32. In one preferred embodiment, trenches 47 and tub structures 32 (including structures 36) have substantially vertical sidewalls. In other embodiments, one or more of these features can have a sloped or tapered profile in cross-sectional view. In some embodiments, trenches 47 comprise separate and distinct trenches. In other embodiments, trench 47 may be a single continuous trench. In some embodiments, tub structures 32 comprise a plurality of separate and distinct structures. In other embodiments, tub structure 32 may be a single continuous structure. After trenches 47 and tub structures 32 (including structures 36) are formed, the photoresist material can be removed. In some embodiments, trenches 47 have a width 147 in a range from about 0.6 microns through about 0.8 microns. Also, in some embodiments, tub structures 32 have a width 132 in a range from about 7 microns through about 12 microns. In other embodiments, trenches 47 and tub structures 32 can be formed using separate masking and removal steps.

FIG. 7 illustrates and enlarged partial cross-sectional view of semiconductor device structure 20 after additional processing. In one embodiment, a layer of conductive material 64 is disposed overlying major surface 18 and over exposed surfaces of trenches 47 and tub structures 32. In accordance with the present embodiment, because of width 147 is substantially less than the width 132, trenches 147 are filled with layer of conductive material 64, and tub structures 32 including structures 36 are lined with layer of conductive material 64. In some embodiments, layer of conductive material 64 can be a doped polycrystalline semiconductor material. In one embodiment, conductive material 64 comprises polysilicon doped with an N-type dopant, such as phosphorous. In one embodiment, the thickness of layer of conductive material 64 is selected to be approximately one-half of width 147. In one embodiment, layer of conductive material 64 has a thickness in a range from about 0.3 microns through about 0.4 microns. Deposition techniques, such low-pressure chemical vapor deposition (LPCVD) techniques, can be used to form layer of conductive material 64.

Next, in an optional step, an isotropic dry etch process can be used to remove portions of layer of conductive material 64 except for those portions of layer of conductive material 64 disposed within trenches 47. This step forms conductive material 48 within trenches 47 to provide conductive trench structures 49 as generally illustrated in FIG. 8. In some embodiments, a residual portion of layer of conductive material 64 may remain along lower surfaces of tub structures 32 and/or structures 36. In one embodiment, a fluorine or chlorine based chemistry can be used to isotropically etch layer of conductive material 64.

FIG. 9 illustrates a partial cross-sectional view of semiconductor device structure 20 after further processing. In one embodiment, a layer of material 66 is disposed overlying major surface 18 and disposed overlying surfaces of tub structures 32 and structures 36. In one embodiment, layer of material 66 comprises an undoped polycrystalline semiconductor material, such as undoped polysilicon. After layer of material 66 is provided, an angled ion implantation step (generally represented by arrows 67) is used to provide a P-type dopant within layer of material 66. In some embodiments, boron ion implantation is used with at least one implant dose in a range from about $5.0 \times 10^{15}$ atoms/cm$^2$ through about $1.0 \times 10^{16}$ atoms/cm$^2$ with at least one implant energy in a range from about 10 keV through about 60 keV.

In a subsequent step, an anisotropic etch step can be used to remove portions of layer of material 66 from lower surfaces of tub structures 32 and from directly overlying major surface 18 to expose portions of masking layers 61/62 as generally illustrated in FIG. 10. In one embodiment, a dry etch process is used with a fluorine or chlorine based chemistry. An anneal step is then used to diffuse dopants from layer of material 66 and conductive material 48 outward into region of semiconductor material 11. In one embodiment, semiconductor device structure 20 is exposed to a temperature in a range from about 900 degrees Celsius through about 1000 degrees Celsius for a time in a range from about 30 minutes through about 60 minutes.

FIG. 11 illustrates a partial cross-sectional view of semiconductor device structure 20 after still further processing. In one embodiment, a layer of material is disposed overlying major surface 18 and disposed within tub structures 32. In some embodiments, the layer of material is either a doped or undoped polycrystalline semiconductor material, such as polysilicon. When undoped, the layer of material can provide a source of P-type dopants. When doped, the layer of material can be doped in-situ during the deposition process, or doped after deposition using ion implantation or other doping techniques as known to those skilled in the art. In a subsequent step, the layer of material is planarized to remove portions of the layer of material leaving other portions of the layer of material with tub structures 32 to provide conductive material 37 for substrate contact structure 31. In some embodiments, an anneal process is used to diffuse the dopants within the contact structures. For example, semiconductor device structure 20 is exposed to a temperature in a range from about 900 degrees Celsius through about 1000 degrees Celsius for a time in a range from about 30 minutes through about 60 minutes. In alternative embodiments, conductive material 37 can be a metal material, a metal material in combination with polycrystalline semiconductor material, or other conductive materials known to those skilled in the art. In accordance with the present embodiment, at this step in the fabrication of semiconductor device structure 20, structures 36 can comprise P-type conductivity from the out-diffusion of P-type dopant from the surrounding conductive material 37. In some embodiments, this provides substrate contact structure 31 configured as a low-resistance conductive path.

Figure 12:
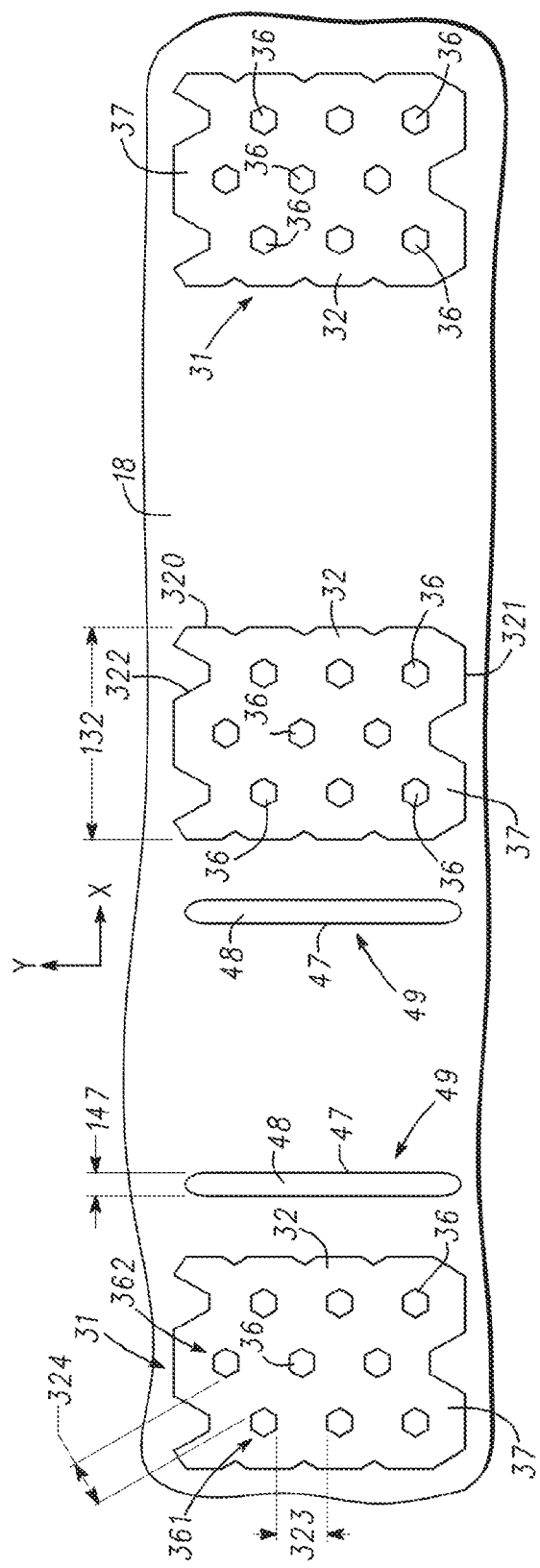
FIG. 12 illustrates a partial top view of contact structure portions in accordance with an embodiment of the present invention.

FIG. 12 illustrates a partial top view of substrate contact structures 31 and conductive trench structures 49 in accordance with one embodiment. In the present embodiment, conductive trench structures 49 comprise a pair of spaced apart elongated trench structures. In other embodiments, conductive trench structure 49 is a continuous trench structure. In one embodiment, substrate contact structures 31 comprise a plurality of spaced apart structures. In other embodiments, substrate contact structure 31 comprises a single continuous structure. In one preferred embodiment, substrate contact structures 31 are configured such that structures 36 comprise adjoining columns (e.g., columns 361 and 362) of structures 36, which are offset (i.e., shifted in the y-direction as depicted in FIG. 12) from each other such that there is a substantially equal distance (represented by distances 323 and 324) between adjoining structures 36. In one embodiment, distances 323 and 324 are in a range from about 1.4 microns through about 1.8 microns. In one preferred embodiment, distances 323 and 324 are about 1.6 microns. In some embodiments, tub structures 32 comprise a perimeter 320 having a profile that is substantially equidistant from adjoining structures 36 on at least two sides, for example sides 321 and 322. In accordance with the present embodiment, the foregoing features provide an improved filled-structure when conductive material 37 is added. That is, conductive material 37 is more evenly distributed within tub structures 32, which provides a more uniform fill and more evenly distributes stresses. As illustrated in FIG. 12, structures 36 may have polygonal shapes in top view or cross-sectional view. In other embodiments, structures 36 may have circular, square, or similar shapes as known to those skilled in the art. In accordance with the present embodiment, structures 36 remain as part of the finished structure and are not consumed during the process to provide conductive material 37. In some embodiments, tub structures 32 have a width 132 in a range from about 7 microns through about 12 microns, and conductive trench structures have a width 147 in a range from about 0.6 microns through about 0.8 microns.

Figure 13:
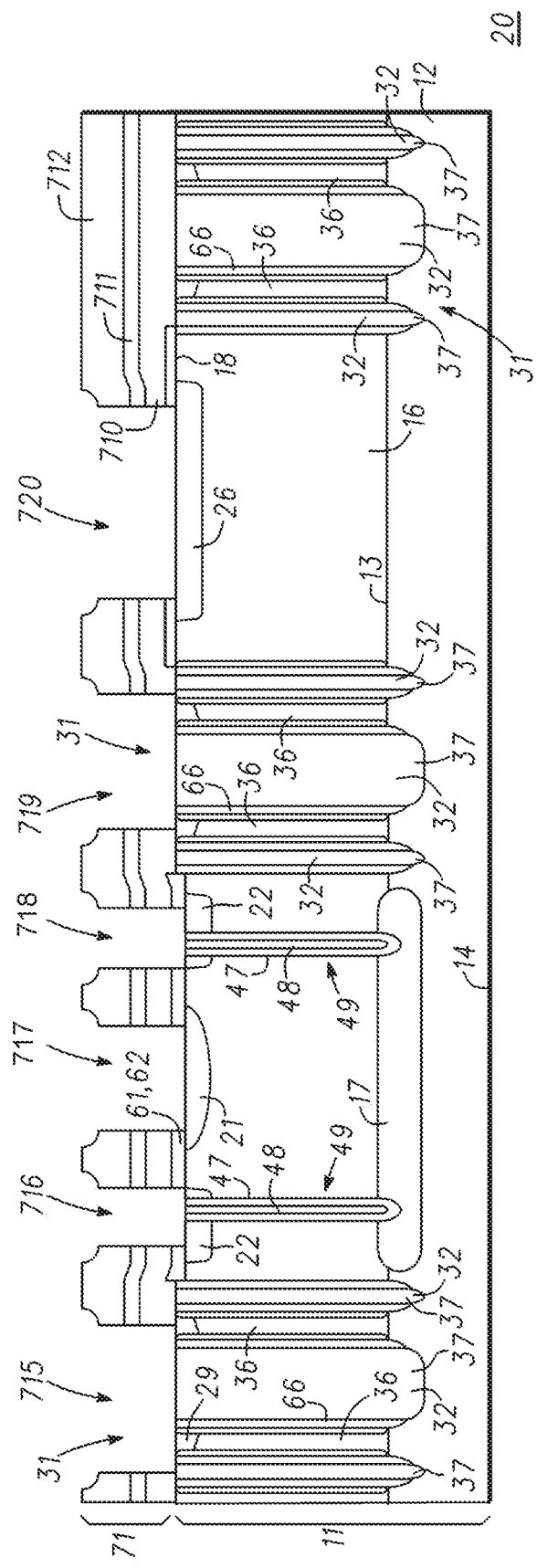
FIGS. 13-15 illustrate enlarged partial cross-sectional views of the semiconductor device structure at further steps in fabrication in accordance with an embodiment of the present invention.

FIG. 13 illustrates a partial cross-sectional view of semiconductor device structure 20 after additional processing. In one embodiment, a dielectric structure 71 is disposed overlying or adjacent major surface 18 of region of semiconductor material 11. In one embodiment, dielectric structure 71 comprises one or more dielectric materials or layers, such oxides, nitrides, combinations thereof, or other materials as known to those skilled in the art. In one preferred embodiment, dielectric structure 71 comprises a deposited oxide 710, a deposited nitride 711, and a deposited oxide 712. In one embodiment, deposited oxide 710 has a thickness in a range from about 0.4 microns through about 0.7 microns and can be formed using LPCVD techniques. Deposited nitride 711 can have a thickness of about 0.1 microns and can be using LPCVD techniques. Deposited oxide 712 can have thickness in a range from about 0.5 microns to about 0.7 microns and can be formed using plasma-enhanced CVD (PECVD) techniques. In one embodiment, dielectric structure 71 can be annealed after formation. In some embodiments, one or more of masking layers 61 and 62 and dielectric structure 71 are configured as dielectric structure 28 illustrated in FIG. 2.

Next, a photolithographic and etch step can be used to pattern dielectric structure 71 to provide predetermined openings 715, 716, 717, 718, 719, an 720, which can expose portions of major surface 18 of region of semiconductor material 11 for contact to doped regions 21, 22, and 26; to trench contact structures 47; and to substrate contact structure 31. At this point in the process, back-seal structure 51 can be removed from adjacent to major surface 14 of substrate 12.

Figure 14:
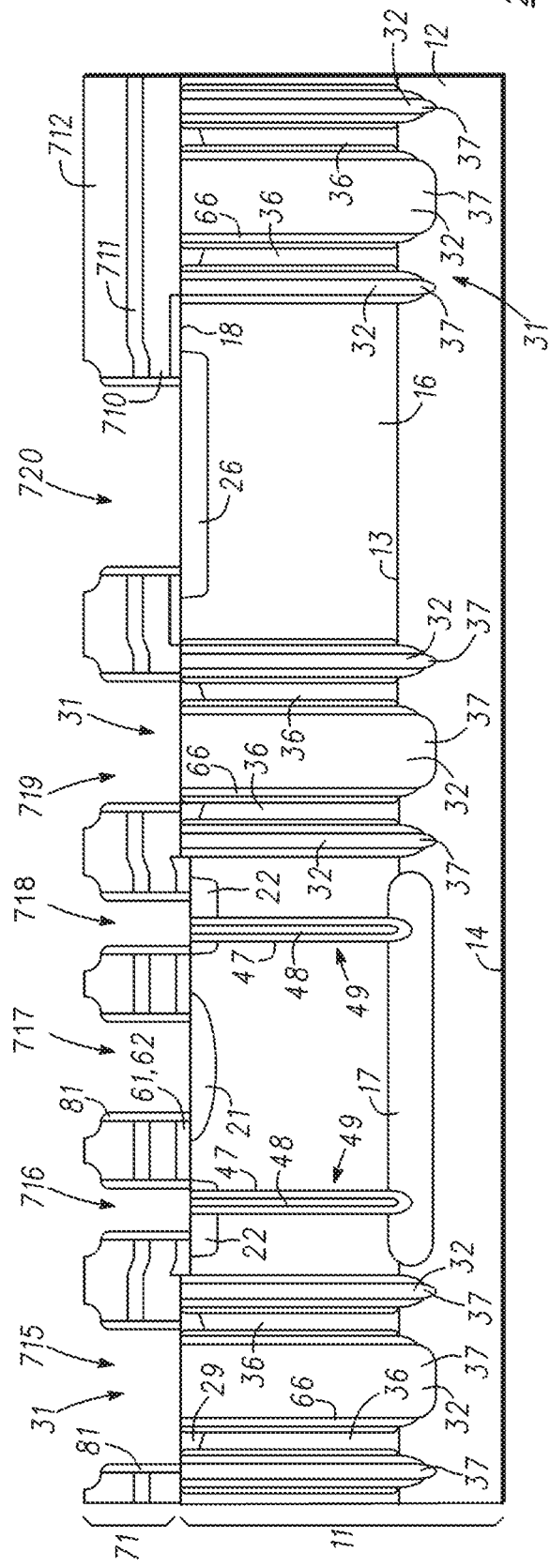

FIG. 14 illustrates a partial cross-sectional view of semiconductor device structure 20 after further processing. In one embodiment, a dielectric layer or masking layer (not shown) is disposed overlying major surface 18 of region of semiconductor material 11 to provide a protective layer for subsequent processing of semiconductor device structure 20 from major surface 14. In one embodiment the masking layer comprises about 0.1 microns to about 0.2 microns of oxide deposited using, for example, PECVD deposition techniques. More particularly, the masking layer is provided to protect major surface 18 exposing through openings 715 to 720. Next, in some embodiments major surface 14 is cleaned, and then a layer of gold/platinum is deposited adjacent major surface 14. In these embodiments, the Au/Pt is used for lifetime control for semiconductor device structure 20. After the Au/Pt is deposited, semiconductor device structure 20 is annealed at about 1100 degrees Celsius to diffuse the Au/Pt into region of semiconductor material 11. In a subsequent step, the masking layer is subjected to a spacer etch process leaving spacers 81 adjacent sidewalls of dielectric structure 71 as generally illustrated in FIG. 14.

Figure 15:
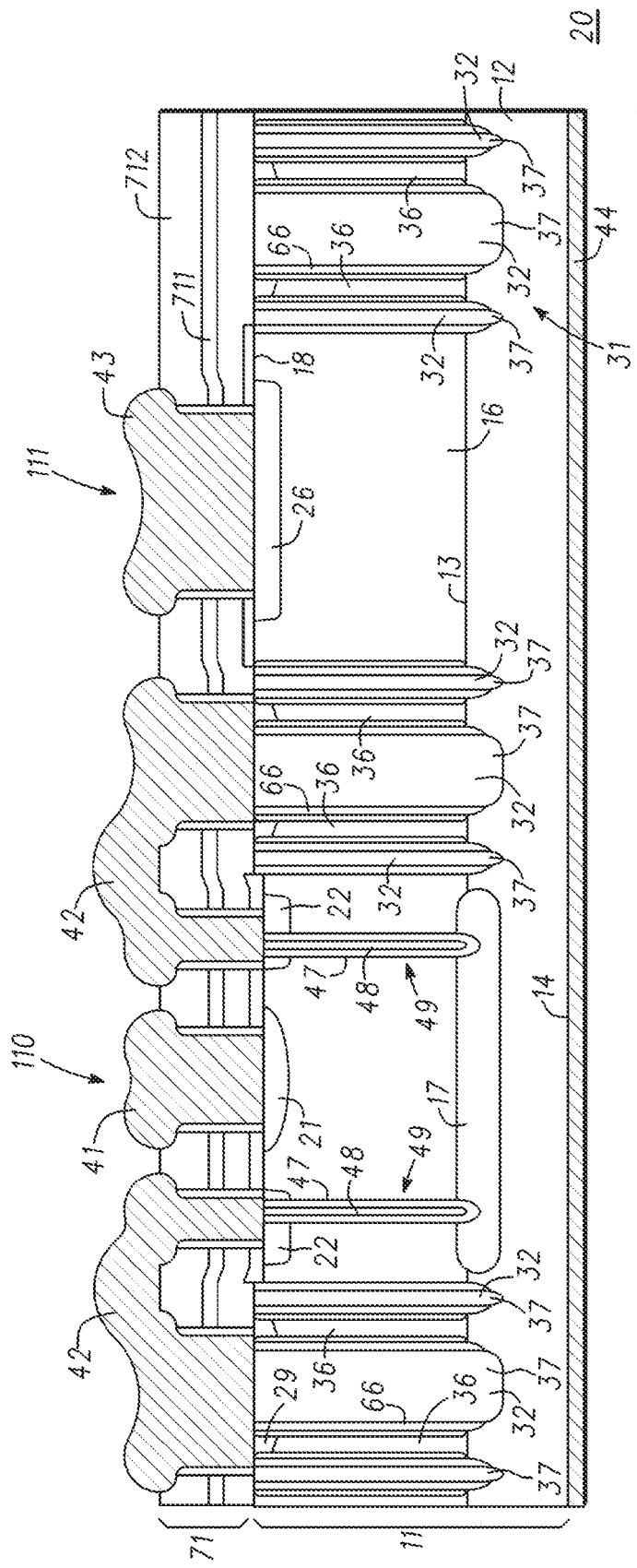

FIG. 15 illustrates a partial cross-sectional view of semiconductor device structure 20 after still further processing. In one embodiment, semiconductor device structure 20 is subjected to a pre-clean process and then a conductive layer is formed overlying dielectric structure 71 and major surface 18. Next, a photolithographic and etch process can be used to pattern the conductive layer to provide electrodes 41, 42, and 43 as generally illustrated in FIG. 15. In one embodiment, the conductive layer comprises a metal material. In some embodiments, electrodes 41, 42, and 43 can comprise Al, Al-alloys, such as AlSi or AlCuSi, Al/Ni/Au, Al/Ni/Cu, Cr/Ni/Au, Ti/Ni/Au, Ti/Cu/Ni/Au, Ti/Ni/Ag, or similar materials as known to those skilled in the art. In one preferred embodiment, electrodes 41, 42, and 43 comprise AlSi and have a thickness in a range from about 0.15 microns through about 0.25 microns. In some embodiments, electrodes 41, 42, and 43 are subjected a sintering process after the electrodes are patterned.

Next, material from substrate 12 can be removed from major surface 14 inward to thin region of semiconductor material 11 to a desired thickness to move major surface 14 inward. In some embodiments, a grinding and etch process can be used for the thinning step. After the thinning step, electrode 44 can be provided along major surface 14. In some embodiments, electrode 44 can sintered Au, Al, Al-alloys, such as AlSi or AlCuSi, or similar materials as known to those skilled in the art. In one preferred embodiment, electrode 44 comprises sintered Au.

In accordance with the present embodiment, the foregoing method provides semiconductor device structure 20 configured as a monolithic series switching diode structure having a lateral diode structure 110 and a vertical diode structure 111. In accordance with the present embodiment, substrate contact structures 31 provide a low-resistance conduction path for lateral diode structure 110 to common electrode 44 disposed along major surface 14 of semiconductor device structure 20. Also, conductive trench structures 49 are configured to reduce leakage current and improve forward conduction performance.

In view of all of the above, it is evident that a novel structure and method is disclosed. Included, among other features, is a substrate contract structure that includes a tub structure, structures, such as free-standing structures, extending upward from a lower surface of the tub structure, and a conductive material disposed in the tub structure surrounding the free-standing structures. In one embodiment, the substrate contact structure is used to enable the formation of a monolithic series switching diode structure. In another embodiment, the monolithic series switching diode structure includes at least one conductive trench structure extending from a cathode region to a buried layer, which was found to reduce leakage current and improve forward conduction performance. The present embodiments provide for, among other things, a series switching semiconductor device with a very low resistance contact structure that, among other things, reduces assembly costs and cycle time. Also, in some embodiments, the present structure and method provide for a smaller package structure.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, substrate contact structures 31 can be used with other types of electronic devices that require low-resistance substrate contacts. Also, structures shown to be formed in a single step can be formed in more than one step, and structures shown to be formed in more than one step can be formed in a single step.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A semiconductor device structure comprising:
   a region of semiconductor material comprising a semiconductor substrate having a first conductivity type and a semiconductor layer of a second conductivity type opposite to the first conductivity type disposed adjacent the semiconductor substrate, the semiconductor layer defining a first major surface and the semiconductor substrate defining an opposing second major surface;
   a first doped region of the first conductivity type disposed in a first portion of the semiconductor layer adjacent the first major surface;
   a second doped region of the second conductivity type disposed in a second portion of the semiconductor layer adjacent the first major surface;
   a third doped region of the second conductivity type disposed in a third portion of the semiconductor layer adjacent the first major surface; and
   a substrate contact structure extending from adjacent the first major surface to the semiconductor substrate, wherein:
      the substrate contact structure is electrically coupled to the second doped region to provide electrical communication between the second doped region and the semiconductor substrate;
      the first doped region, the semiconductor layer, and second doped region are configured as a lateral diode structure;
      the third doped region, the semiconductor layer, and the semiconductor substrate are configured as a vertical diode structure; and
      the second major surface provides a common electrode for both the lateral diode structure and the vertical diode structure.

2. The structure of claim 1, wherein the substrate contact structure comprises:
   a tub structure extending from the first major surface;
   a plurality of structures comprising portions of the semiconductor layer; and
   a conductive material disposed within the tub structure and laterally surrounding the plurality of structures.

3. The structure of claim 2, wherein the conductive material comprises a polycrystalline semiconductor material having the first conductivity type.

4. The structure of claim 2, wherein:
   the plurality of structures comprises a plurality of free-standing structures formed in columns; and
   adjoining columns are offset from each other such that there is a substantially equal distance between adjoining free-standing structures.

5. The structure of claim 2, wherein the tub structure comprises a perimeter substantially equidistant from adjoining structures on at least two sides.

6. The structure of claim 2, wherein the plurality of structures comprises the first conductivity type.

7. The structure of claim 1 further comprising a buried layer region disposed adjacent an interface between the semiconductor substrate and the semiconductor layer underlying the lateral diode structure, the buried layer region having the second conductivity type.

8. The structure of claim 7 further comprising a conductive trench structure disposed extending from the first major surface through the second doped region to the buried layer region.

9. The structure of claim 1 further comprising:
   a first electrode electrically coupled to the first doped region;
   a second electrode electrically coupled to the second doped region and the substrate contact structure;
   a third electrode electrically coupled to the third doped region; and
   a fourth electrode providing the common electrode adjacent the second major surface.

10. The structure of claim 1, wherein the substrate contact structure is laterally interposed between the second doped region and third doped region.

11. A semiconductor device structure comprising:
    a region of semiconductor material having a first major surface and an opposing second major surface; and
    a contact structure disposed in a first portion of the region of semiconductor material comprising:
       a tub structure extending inward into the region of semiconductor material from adjacent the first major surface;
       a plurality of structures comprising portions of the region of semiconductor material and defined by side surfaces of the tub structure; and
       a conductive material disposed within the tub structure and laterally surrounding the plurality of structures.

12. The structure of claim 11, wherein:
    the region of semiconductor material comprises a semiconductor substrate having a first conductivity type and a semiconductor layer of a second conductivity type opposite to the first conductivity type disposed adjacent the semiconductor substrate, the semiconductor layer defining the first major surface and the semiconductor substrate defining the second major surface;
    the contact structure extends to the semiconductor substrate;
    the plurality of structures comprises a plurality of free-standing structures;
    the semiconductor device structure further comprises:
       a first doped region of the first conductivity type disposed in a second portion of the semiconductor layer adjacent the first major surface;
       a second doped region of the second conductivity type disposed in the semiconductor layer at least proximate to the contact structure; and a third doped region of the second conductivity type disposed in a third portion of the semiconductor layer adjacent the first major surface;

the contact structure is electrically coupled to the second doped region to provide electrical communication between the second doped region and the semiconductor substrate;

the first doped region, the semiconductor layer, and second doped region are configured as a lateral diode structure;

the third doped region, the semiconductor layer, and the semiconductor substrate are configured as a vertical diode structure; and the second major surface provides a common electrode for both the lateral diode structure and the vertical diode structure.

13. The structure of claim 12 further comprising a buried layer region disposed adjacent an interface between the semiconductor substrate and the semiconductor layer underlying the lateral diode structure, the buried layer region having the second conductivity type.

14. The structure of claim 13 further comprising a conductive trench structure disposed extending inward into the region of semiconductor material from the first major surface through the second doped region to the buried layer region.

15. The structure of claim 11, wherein the conductive material comprises a polycrystalline semiconductor material.

16. The structure of claim 11, wherein:
the plurality of structures comprises a plurality of columns that are spaced apart;
adjoining columns are offset from each other such that there is a substantially equal distance between adjoining structures; and
the tub structure comprises a perimeter substantially equidistant from adjoining structures of the plurality of structures on at least two sides.

17. A semiconductor device structure comprising:
a region of semiconductor material comprising a semiconductor substrate having a first conductivity type and a semiconductor layer of a second conductivity type opposite to the first conductivity type disposed adjacent the semiconductor substrate, the semiconductor layer defining a first major surface and the semiconductor substrate defining an opposing second major surface;

a first doped region of the first conductivity type disposed in a first portion of the semiconductor layer adjacent the first major surface;

a second doped region of the second conductivity type disposed in a second portion of the semiconductor layer adjacent the first major surface;

a third doped region of the second conductivity type disposed in a third portion of the semiconductor layer adjacent the first major surface; and a substrate contact structure extending from adjacent the first major surface to the semiconductor substrate, wherein:
the substrate contact structure is electrically coupled to the second doped region to provide electrical communication between the second doped region and the semiconductor substrate;
the substrate contact structure is laterally interposed between the second doped region and third doped region;
the first doped region, the semiconductor layer, and second doped region are configured as a lateral diode structure;
the third doped region, the semiconductor layer, and the semiconductor substrate are configured as a vertical diode structure; and
the second major surface provides a common electrode for both the lateral diode structure and the vertical diode structure.

18. The structure of claim 17, wherein the substrate contact structure comprises:
a tub structure extending from the first major surface;
a plurality of structures comprising portions of the semiconductor layer; and
a conductive material disposed within the tub structure and laterally surrounding the plurality of structures.

19. The structure of claim 17 further comprising a buried layer region disposed adjacent an interface between the semiconductor substrate and the semiconductor layer underlying the lateral diode structure, the buried layer region having the second conductivity type.

20. The structure of claim 19 further comprising a conductive trench structure disposed extending from the first major surface through the second doped region to the buried layer region.

* * * * *